(12) United States Patent  
Zhu et al.

(10) Patent No.: US 7,589,574 B2
(45) Date of Patent: *Sep. 15, 2009

(54) SYSTEM AND METHOD FOR POWER ON RESET AND UNDER VOLTAGE LOCKOUT SCHEMES

(75) Inventors: Zhen Zhu, Shanghai (CN); Jun Ye, Shanghai (CN); Zhiliang Chen, Shanghai (CN); Lieyi Fang, Shanghai (CN)

(73) Assignee: On-Bright Electronics (Shanghai) Co., Ltd., Shanghai (CN)

( * ) Notice: Subject to any disclaimer, the term of this patent is extended or adjusted under 35 U.S.C. 154(b) by 0 days.

This patent is subject to a terminal disclaimer.

(21) Appl. No.: 11/870,378

(22) Filed: Oct. 10, 2007

(65) Prior Publication Data

US 2008/0197895 A1 Aug. 21, 2008

Related U.S. Application Data

(63) Continuation of application No. 11/407,682, filed on Apr. 19, 2006, now Pat. No. 7,298,187.

(30) Foreign Application Priority Data

Mar. 10, 2006 (CN) .................. 2006 1 0024670

(51) Int. Cl. *H03L 7/00* (2006.01)

(52) U.S. Cl. .................. 327/143; 327/142; 327/198
(58) Field of Classification Search .................. None
See application file for complete search history.

(56) References Cited

U.S. PATENT DOCUMENTS 5,313,112 A * 5/1994 Macks .................. 327/143
6,259,287 B1 * 7/2001 Macks .................. 327/143

* cited by examiner

*Primary Examiner*—An T Luu
(74) *Attorney, Agent, or Firm*—Jones Day

(57) ABSTRACT

A system and method for power-on reset and under-voltage lockout schemes. The system includes a first transistor, which includes a first gate, a first terminal, and a second terminal, the second terminal being biased to a predetermined voltage. The system includes a second transistor, which include a second gate, a third terminal, and a fourth terminal, the third terminal being configured to receive an input voltage. The system includes a first resistor that is associated with a first resistance. The first resistor includes a fifth terminal and a sixth terminal, the fifth terminal being configured to receive the input voltage. The system includes a second resistor that is associated with a second resistance. The second resistor includes a seventh terminal and an eighth terminal, the seventh terminal being coupled to the sixth terminal. The system includes a first Zener diode that is associated with a first Zener voltage.

15 Claims, 9 Drawing Sheets

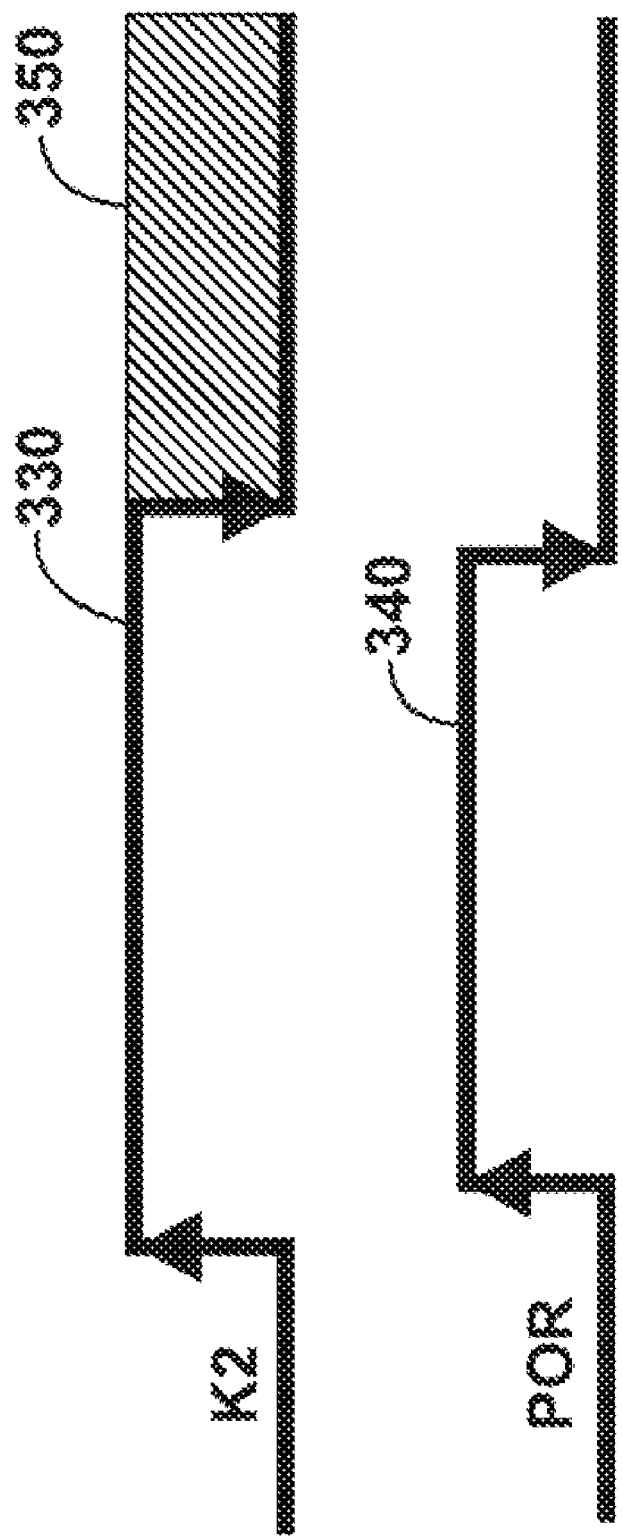

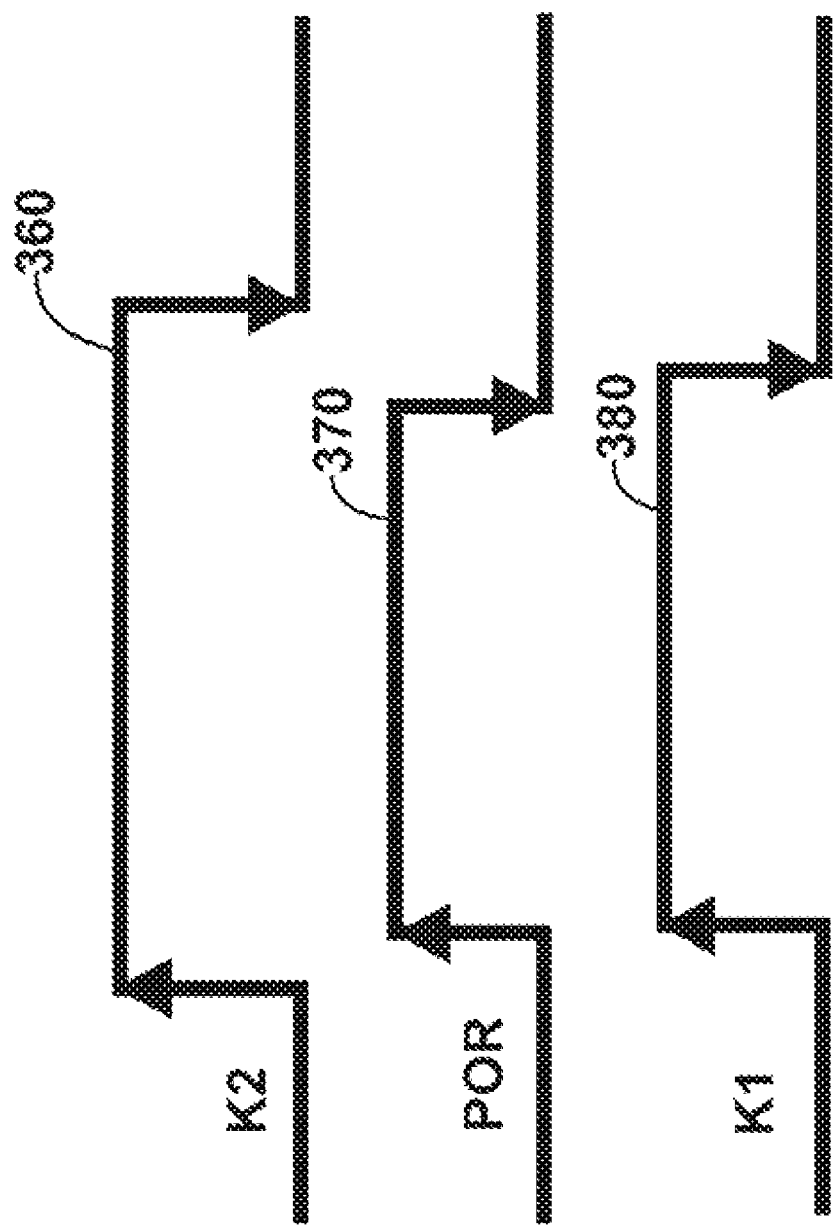

SYSTEM AND METHOD FOR POWER ON RESET AND UNDER VOLTAGE LOCKOUT SCHEMES

CROSS-REFERENCES TO RELATED APPLICATIONS

This application is a continuation of U.S. application Ser. No. 11/407,682, filed Apr. 19, 2006, now U.S. Pat. No. 7,298,187 which claims priority to Chinese Patent Application No. 200610024670.2, filed Mar. 10, 2006, titled "System and Method for Power On Reset and Under Voltage Lockout Schemes," by inventors Zhen Zhu, Jun Ye, Zhiliang Chen, and Lieyi Fang. These applications are commonly assigned, incorporated by reference herein for all purposes.

BACKGROUND OF THE INVENTION

The present invention relates in general to integrated circuits. More specifically, the invention provides a system and method for power-on reset (POR) and under-voltage lockout (UVLO) schemes. Merely by way of example, the invention is described as it applies to electronic power systems, but it should be recognized that the invention has a broader range of applicability.

Power-on reset (POR) and under-voltage lockout (UVLO) circuits have a wide range of applications. For example, in an electronic system during power on and off transitions, the power supply voltage, typically in order of several to tens of volts, often falls into an invalid state. During an initialization or power-up stage, which usually takes place when the supply voltage for the electronic system is switched on, the supply voltage rises from zero to an operational supply voltage. The operational supply voltage is often within a range associated with a source impedance or source current. During the process when the supply voltage rises from zero to an operational supply voltage, the supply voltage is less than a certain minimum voltage at which the electronic system is designed to properly function. Therefore it is often desirable to prevent any functioning of the electronic system when the supplied voltage is less than the minimum voltage. Generally, the electronic system should be in a reset mode when the supplied voltage is less than a threshold voltage, which is often the minimum voltage. When the electronic system is in the reset mode, components of the electronic system generally stay in their well-defined initial states, ready to properly function after the electronic system starts.

To ensure that an electronic system properly initializes, a voltage detection circuit is often used to generate an output signal to indicate whether the supply voltage has reached a threshold or minimum voltage level. The output signal of the voltage detection circuit is accordingly used to enable or disable the functioning of circuit components.

Often POR and UVLO (POR/UVLO) circuits are used as a voltage detection circuit. In application, a POR/UVLO circuit in an electronic system monitors power supply voltage. When the power supply voltage reaches a predetermined voltage level, which could be a minimum supply voltage or a first threshold voltage, the POR/UVLO circuit generates a POR signal. The POR signal is an indicator to other components of the electronic system that the electronic system has been turned on. In certain instances, the POR/UVLO circuit generates a power-on reset indication when the system power ramps up to the first threshold level that allows the electronic system to operate. In response to the power-on reset indication, other components of the electronic system perform various useful functions. For example, the system components can reset latches and perform start-up operations. When the power supply voltage drops under a second threshold voltage, which may be substantially equally to the first threshold voltage or may be different, the POR/UVLO circuit indicates to the electronic system by generating a UVLO signal. In response to the UVLO signal, the electronic system may shuts down some or all of its components in order to protect the system.

FIG. 1 illustrates an example of conventional system for power switching with POR/UVLO functions. The power switching system 100 includes, inter alia, a power supply 101 and a pulse width modulation (PWM) controller circuit 120. The power supply 101 includes an alternative current (AC) source 102, a rectifier 105, and a start up resistor 110. The PWM controller circuit 120 includes, inter alia, a PWM generator 122 and a POR/UVLO circuit 124. During operation, the power supply 101 supplies voltages to the PWM controller circuit 120, and the AC source 102 feeds an alternating current, which is rectified by the rectifier 105 and runs through the start up resistor 110. The PWM controller circuit 120 often uses the start up resistor 110 to start the PWM generator 122. The POR/UVLO circuit 124 provides indication signals to the PWM generator 122 to ensure that power switching system 100 is operating properly.

A POR/UVLO system is a useful application. However, conventional POR/UVLO systems, such as the conventional system illustrated on FIG. 1, generally consume a great amount of power due to high impedance. More specifically, the start up resistor 110 can be a source of significant energy inefficiency. This is because the voltage drop caused by the start up resistor 110, which is the difference between the output voltage 106 and the low voltage supply (VDD) 112, is large. As an example, the output voltage 106 is 370 volts DC, while the VDD 112 is only at 12 volts DC. Under light load or low load conditions, the power loss caused by the large voltage drop is great. To improve energy efficiency, a large start up resistor 110, whose resistance may be in order of mega ohms, is often used. However, the larger resistance not only improves energy efficiency, but also, as being a drawback, significantly lowers the source current, which can be as low as several tens of micro amps, being supplied to the PWM generator 122.

Hence it is highly desirable to improve techniques for power-on reset and under-voltage lockout schemes.

BRIEF SUMMARY OF THE INVENTION

The present invention relates in general to integrated circuits. More specifically, the invention provides a system and method for POR and UVLO schemes. Merely by way of example, the invention is described as it applies to electronic power systems, but it should be recognized that the invention has a broader range of applicability.

According to an embodiment, the present invention presents a system for providing power-on reset and under-voltage lockout signals. The system includes a first transistor, which includes a first gate, a first terminal, and a second terminal, the second terminal being biased to a predetermined voltage. The system also includes a second transistor, which include a second gate, a third terminal, and a fourth terminal, the third terminal being configured to receive an input voltage. Additionally, the system includes a first resistor that is associated with a first resistance. The first resistor includes a fifth terminal and a sixth terminal, the fifth terminal being configured to receive the input voltage. The system also includes a second resistor that is associated with a second resistance. The second resistor includes a seventh terminal and an eighth terminal, the seventh terminal being coupled to the sixth terminal. In addition, the system includes a first Zener diode that is associated with a first Zener voltage. The first Zener diode includes a ninth terminal and a tenth terminal, the ninth terminal being biased to the predetermined voltage. Moreover, the system includes a second Zener diode that is associated with a second Zener voltage. The second Zener diode includes an eleventh terminal and a twelfth terminal. the system additionally includes a third resistor that is associated with a third resistance. The third resistor includes a thirteenth terminal and a fourteenth terminal, the fourteenth terminal being biased to the predetermined voltage. At the system, the first gate is coupled to the fourth terminal and the thirteenth terminal to generate a first signal. The first signal is capable of being associated with at least one of a power-on reset or an under-voltage lockout. The second gate is coupled to the eighth terminal and the twelfth terminal. And the first terminal, the tenth terminal and the eleventh terminal are coupled to each other.

According to an alternative embodiment, the present invention provides a system for providing power-on reset and under-voltage lockout signals. The system includes a first transistor, which includes a first gate, a first terminal, and a second terminal, the second terminal being biased to a predetermined voltage. The system additionally includes a second transistor, which includes a second gate, a third terminal, and a fourth terminal, the third terminal being configured to receive an input voltage. In addition, the system includes a first resistor that is associated with a first resistance. The first resistor includes a fifth terminal and a sixth terminal, the fifth terminal being configured to receive the input voltage. The system also includes a second resistor that is associated with a second resistance. The second resistor includes a seventh terminal and an eighth terminal, the seventh terminal being coupled to the sixth terminal. In addition, the system includes a first Zener diode that is associated with a first Zener voltage. The first Zener diode includes a ninth terminal and a tenth terminal, the ninth terminal being biased to the predetermined voltage. Additionally, the system includes a second Zener diode that is associated with a second Zener voltage. The second Zener diode includes an eleventh terminal and a twelfth terminal. The system additionally includes a third resistor that is associated with a third resistance. The third resistor includes a thirteenth terminal and a fourteenth terminal, the fourteenth terminal coupled to the second terminal. Moreover, the system includes a third transistor, which includes a third gate, a fifteenth terminal, and a fourteenth terminal. The fifteenth terminal is configured to receive the input voltage, and sixteenth terminal are coupled to the sixth terminal. The system additionally includes a first inverter that includes a first inverter input and a first inverter output. The system also includes a second inverter that includes a second inverter input and a second inverter output. The second inverter input is coupled to the first inverter output, and the second inverter output is coupled to the third gate. At the system, the first gate is coupled to the fourth terminal and the thirteenth terminal. The second gate is coupled to the eighth terminal and the twelfth terminal. The first terminal, the tenth terminal and the eleventh terminal are coupled to each other. The second inverter output is configured to generate a signal, the signal capable of being associated with at least one of a power-on reset or an under-voltage lockout.

According to another alternative embodiment, the present invention provides a system for providing power-on reset and under-voltage lockout signals. The system includes a first transistor, which includes a first gate, a first source, and a first drain. The first source is biased at a predetermined voltage. The system also includes a second transistor that includes a second gate, a second source, and a second drain. The second gate is coupled to the first drain, and the second source being biased at the predetermined voltage. In addition, the system includes a third transistor, which includes a third gate, a third source, and a third drain. The third source is biased at a predetermined voltage. Additionally, the system includes a first resistor that includes a first terminal and a second terminal. The first terminal is biased at the predetermined voltage. The system also includes a second resistor. The second resistor includes a third terminal and a fourth terminal. The third terminal is coupled to the second terminal. The fourth terminal is coupled to the first gate. The system also includes a third resistor. The third resistor includes a fifth terminal and a sixth terminal. The fifth terminal is coupled to the fourth terminal. The system additionally includes a fourth resistor, which includes a seventh terminal and an eighth terminal. The eighth terminal is configured to receive the input voltage. The seventh terminal being coupled to the second gate. The system additionally includes a first Zener diode that includes a ninth terminal and a tenth terminal. The ninth terminal is coupled to the sixth terminal. The tenth terminal is coupled to the second drain. They system also includes a second Zener diode. The second diode includes an eleventh terminal and a twelfth terminal. The eleventh terminal is coupled to the tenth terminal. The twelfth terminal is configured to receive the input voltage. The system also includes a first inverter that includes a first inverter input and a first inverter output. The first inverter input is coupled to the first drain. Additionally, the system includes a second inverter, which includes a second inverter input and a second inverter output. The second inverter input is coupled to the first inverter output. The second inverter output is coupled to the third gate. At the system, the second inverter output is configured to generate a signal. The signal is capable of being associated with at least one of a power-on reset and an under-voltage lockout.

According to another alternative embodiment, the present invention provides a system for providing power-on reset and under-voltage lockout signals. The system includes a first transistor, which includes a first gate, a first terminal, and a second terminal. The second terminal is biased to a predetermined voltage. Additionally, the system includes a second transistor, which includes a second gate, a third terminal, and a fourth terminal. The third terminal is configured to receive an input voltage. The system also includes a first diode associated with a forward voltage. The first diode includes a fifth terminal and a sixth terminal. The fifth terminal is configured to receive the input voltage. In addition, the system includes a second resistor associated with a second resistance. The second resistor includes a seventh terminal and an eighth terminal. The seventh terminal being coupled to the sixth terminal. The system additionally includes a first Zener diode associated with a first Zener voltage. The first Zener diode includes a ninth terminal and a tenth terminal. The ninth terminal is biased to the predetermined voltage. The system also includes a second Zener diode associated with a second Zener voltage. The second Zener diode includes an eleventh terminal and a twelfth terminal. Additionally, the system includes a third resistor associated with a third resistance. The third resistor includes a thirteenth terminal and a fourteenth terminal. The fourteenth terminal is coupled to the second terminal. Additionally, the system includes a third transistor, which includes a third gate, a fifteenth terminal, and a fourteenth terminal. The fifteenth terminal is configured to received the input voltage. The sixteenth terminal is coupled to the sixth terminal. The system also includes a first inverter, which includes a first inverter input and a first inverter output.

Moreover, the system includes a second inverter, which includes a second inverter input and a second inverter output. The second inverter input is coupled to the first inverter output. The second inverter output is coupled to the third gate. The first gate is coupled to the fourth terminal and the thirteenth terminal. The second gate is coupled to the eighth terminal and the twelfth terminal. The first terminal, the tenth terminal and the eleventh terminal are coupled to each other. The second inverter output is configured to generate a signal, the signal capable of being associated with at least one of a power-on reset or an under-voltage lockout.

According to another alternative embodiment, the present invention provides a system for providing power-on reset and under-voltage lockout signals. The system includes a first transistor, which includes a first gate, a first source, and a first drain. The first source is biased at a predetermined voltage. Additionally, the system includes a second transistor, which includes a second gate, a second source, and a second drain. The second gate is coupled to the first drain. The second source is configured to receive an input voltage. The system also includes a third transistor, which includes a third gate, a third source, and a third drain. The third source is biased at the predetermined voltage. The system also includes a first diode, which includes a first terminal and a second terminal. The first terminal is biased at the predetermined voltage. Additionally, the system includes a second resistor. The second resistor includes a third terminal and a fourth terminal. The third terminal is coupled to the second terminal. The fourth terminal is coupled to the first gate. The system also includes a third resistor, which includes a fifth terminal and a sixth terminal. The fifth terminal is coupled to the fourth terminal. Moreover, the system includes a fourth resistor, which includes a seventh terminal and an eighth terminal. The eighth terminal is configured to receive the input voltage. The seventh terminal is coupled to the second gate. The system also includes a first Zener diode, which includes a ninth terminal and a tenth terminal. The ninth terminal is coupled to the sixth terminal, and the tenth terminal is coupled to the second drain. Additionally the system includes a second Zener diode. The second Zener diode includes an eleventh terminal and a twelfth terminal. The eleventh terminal is coupled to the tenth terminal. The twelfth terminal is configured to receive the input voltage. The system additionally includes a first inverter. The first inverter includes a first inverter input and a first inverter output. The first inverter input is coupled to the first drain. The system also includes a second inverter, which includes a second inverter input and a second inverter output. The second inverter input is coupled to the first inverter output. The second inverter output is coupled to the third gate. The second inverter output is configured to generate a signal. The signal is capable of being associated with at least one of a power-on reset and an under-voltage lockout.

Many benefits are achieved by way of the present invention over conventional techniques. It is to be appreciated that certain embodiments of the present invention provide a system and method for POR/UVLO schemes that provide lower power consumption and better reliability. According to an embodiment of the present invention, two positive feedback loops are used to ensure the reliability of the UVLO function.

Depending upon embodiment, one or more of these benefits may be achieved. These benefits and various additional objects, features and advantages of the present invention can be fully appreciated with reference to the detailed description and accompanying drawings that follow.

BRIEF DESCRIPTION OF THE DRAWINGS

FIG. 3b is a timing diagram illustrating the voltages levels at an NMOS and a second inverter according to another embodiment of the present invention;

FIG. 3c is a timing diagram illustrating the voltages levels at an NMOS, a first PMOS, and a second inverter according to yet another embodiment of the present invention;

DETAILED DESCRIPTION OF THE INVENTION

The present invention relates in general to integrated circuits. More specifically, the invention provides a system and method for POR and UVLO schemes. Merely by way of example, the invention is described as it applies to electronic power systems, but it should be recognized that the invention has a broader range of applicability.

Figure 1:
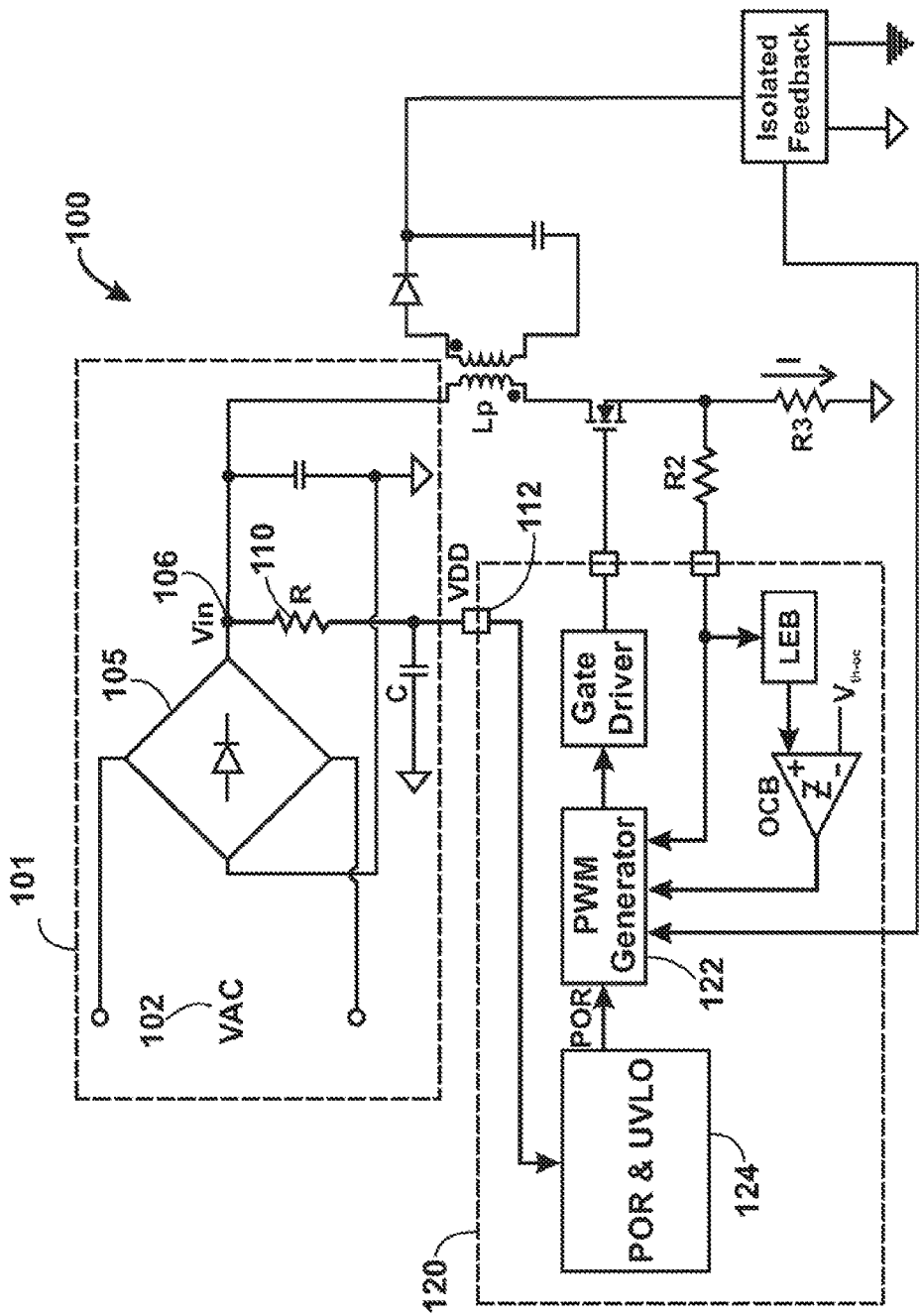
FIG. 1 illustrates an example of conventional system for power switching with POR/UVLO functions.
Figure 2:
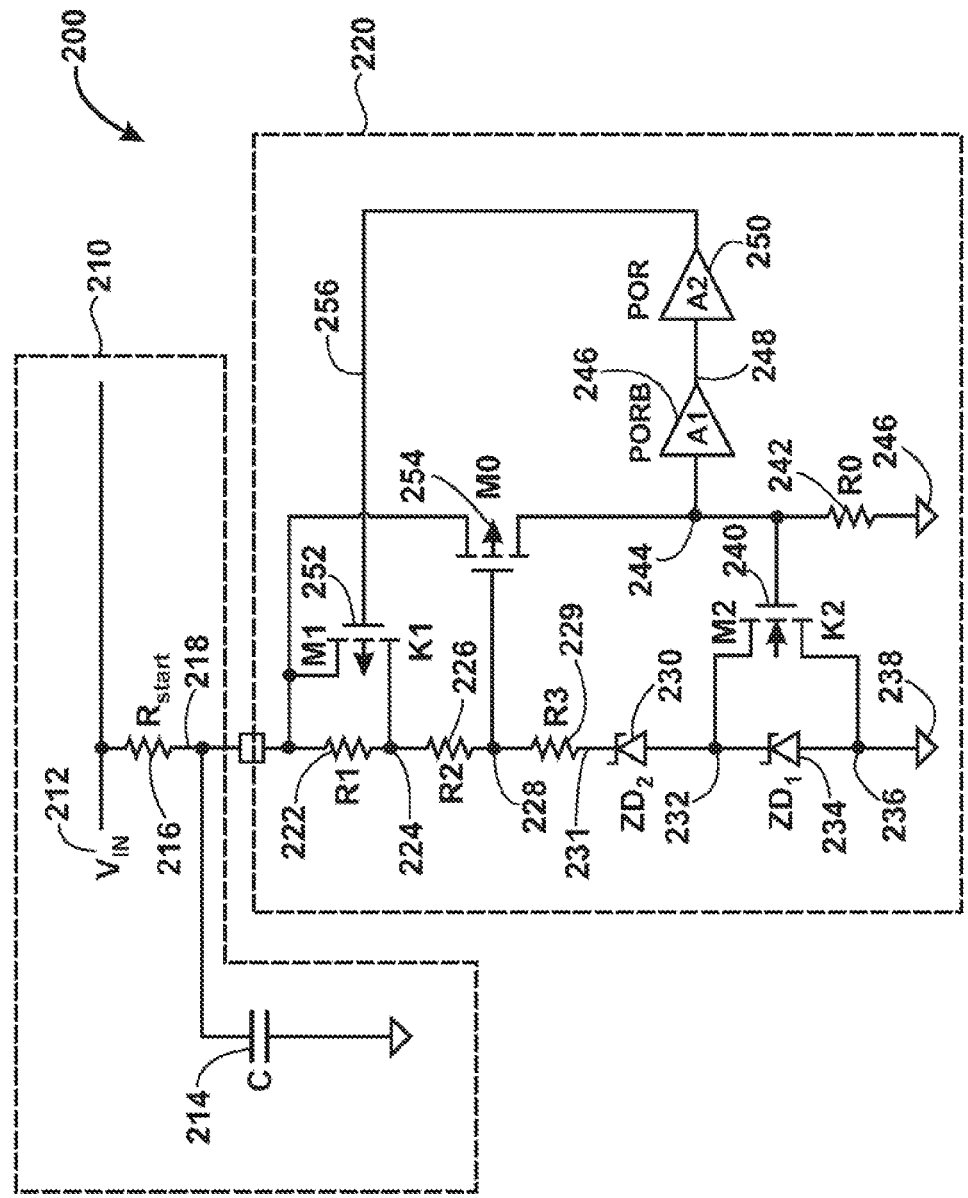
FIG. 2 is a simplified diagram of an embodiment of the present invention for a system for POR/UVLO schemes.

FIG. 2 is a simplified diagram of an embodiment of the present invention for a system for POR/UVLO schemes. This diagram is merely an example, which should not unduly limit the scope of the claims. One of ordinary skill in the art would recognize many variations, alternatives, and modifications. As shown in FIG. 2, a POR/UVLO system 220 is connected to a power source 210. The power source 210 includes a voltage source 212, a start up resistor 216, and a capacitor 214. The POR/UVLO system 220 includes a first resistor 222, a second resistor 226, a third resistor 242, a fourth resistor 229, a first Zener diode 230, a second Zener diode 234, a first PMOS 252, a second PMOS 254, an NMOS 240, a first inverter 246, and a second inverter 250. As an example, the first Zener diode is characterized by a first Zener voltage and the second Zener diode is characterized by a second Zener voltage. Although the above has been shown using a selected group of components for the POR/UVLO system 220, there can be many alternatives, modifications, and variations. For example, some of the components may be expanded and/or combined. Other components may be inserted to those noted above. Depending upon the embodiment, the arrangement of components may be interchanged with other replaced.

According to an embodiment of the invention, at the power source 210, the voltage source 212 is connected to the start up resistor 216 at one end. The other end of the start up resistor 216 is connected to a node 218. The capacitor 214 is grounded at one end and connected to the node 218 at the other end. The output of the power source 210 is connected to the node 218. The POR/UVLO system 220 receives power at the node 218. The first resistor 222 is connected to the power source 210 at the node 218 and the second resistor 226 at the node 224. Also connected to the node 218 is the source of the first PMOS 252. The drain of the first PMOS 252 is connected to the node 224. For example, when there is a proper amount of voltage at the gate of the first PMOS 252, there is little resistance between the source and the drain of the first PMOS 252 and the resistor 222 is essentially shorted. The second resistor 226 is connected to the gate of the second PMOS 254 and the fourth resistor 229 at the node 228. The fourth resistor is connected to the first Zener diode 230 at the node 231. The first Zener diode 230 is connected to the second Zener diode 234 at the node 232. The second Zener diode 234 is grounded at the node 236. Also connected to the node 232 is drain of the NMOS 240, which is connected to the ground at its source. The gate of the NMOS 240 is connected to the third resistor 242 at the node 244. The third resistor 242 is connected to the ground at the node 246. For example, when there is a proper amount of voltage at the gate of the NMOS 240, there is little resistance between the source and the drain of the NMOS 240 and the second Zener diode 234 is essentially shorted. The gate of the NMOS 240 is also connected to the first inverter 246 and the drain of the second PMOS 254 at the node 244. The source of the second PMOS 254 is connected to the node 218. The gate of the second PMOS 254 is connected to the node 228. The first inverter 246 is connected to the second inverter 250 at the node 248. The second inverter 250 is connected to the gate of the first PMOS 252 at the node 256. The second inverter 250 provides an output signal for the POR/UVLO system 220.

According to an embodiment of the present invention, the POR/UVLO system 220 operates as two positive feedback loops. A first loop includes the second PMOS 254, the NMOS 240, the first Zener diode 230, the second Zener diode 234, the second resistor 226, the third resistor 242, and the fourth resistor 229. A second loop includes the first PMOS 252, the second PMOS 254, the NMOS 240, the first inverter 246, the second inverter 250, the second Zener diode 230, the first resistor 222, the second resistor 226, the third resistor 242, and the fourth resistor 229.

As an example, when power source 210 starts up, the voltage source 212 charges the capacitor 214 through the start up resistor 216. During the start up, the voltage at node 218 ramps up from zero voltage. When the voltage at node 218 is lower than the sum of the first and the second Zener voltages, no current flows between the node 218 and the node 224. As a result, the first PMOS 252 is turned on, the second PMOS 254 is turned off, the NMOS 240 is turned off, the output of the first inverter 246 is logic high, and the output of the second inverter 250 is logic low.

Once the voltage at node 218 reaches a predetermined threshold voltage Vstart, the second PMOS 254 is turned on and begins conducing current. According an embodiment of the present invention, the threshold voltage Vstart may be determined by the following equation.

$$Vstart = Vzd1 + Vzd2 + \frac{R2+R3}{R2} VT\_M0 \quad \text{(Equation 1)}$$

According to Equation 1, Vdz1 and Vzd2 are the first Zener voltage and the second Zener voltage, R2 is the resistance of the second resistor 226, R3 is the resistance of the fourth resistor 229, and VT_M0 is the threshold voltage of the second PMOS 254. Once the threshold voltage Vstart is reached, the second PMOS 254 is turned on and starts conducting current. As a result, a voltage Vr0 starts rising up between the node 244 and the ground 246. Once the voltage Vr0 reaches the threshold voltage of the NMOS 240, the NMOS 240 is turned on and begins conducting current. The current being conducted by the first NMOS 240 increases as the gate voltage (at the node 242) of the NMOS 240. As a result of the increased current flow across the NMOS 240, the Vgs (voltage between gate and source, or voltage difference between the node 218 and the node 228) of the second PMOS 254 builds up due to current flowing through the second resistor 226. As the Vgs of the second PMOS 254 increases, more electrical current flows through the third resistor 242, thus increasing the voltage at the node 244.

In short, the first positive feedback loop is formed according to the present embodiment of the invention: a higher voltage from the voltage source 210 causes the second PMOS 254 to conduct current, the current conducted by the second PMOS 254 causes the NMOS 240 to conduct current, the current conducted by the NMOS 240 causes the second PMOS 254 to conduct more current, and the positive feedback process continues. When the NMOS 240 is fully turned on, the second Zener diode 234 is shorted by the first NMOS 240. As a result of the second Zener diode 234 being shorted, the gate voltage Vgs of the second PMOS 254 is large enough to ensure that the voltage at the node 244 is substantially equal to the voltage at the node 218. Because of the voltage at the node 244, the output of the first inverter 245 is logic low and the output of the second inverter 250 is logic high. The output of the second inverter 250 is provided at the node 256 to the first PMOS 252.

As discussed above, a second loop includes the first PMOS 252, the second PMOS 254, the NMOS 240, the first inverter 246, the second inverter 250, the second Zener diode 230, the first resistor 222, the second resistor 226, the third resistor 242, and the fourth resistor 229 according to an embodiment of the present invention. The voltage at the node 256, provided by the second inverter 250, turns the first PMOS 252 on or off. When the output of the second inverter 250 is logic high, the first PMOS 252 is turned off. For example, the first PMOS 252 is not conducting current. The first PMOS 252 being turned off ensures that the second PMOS 254 stays on and continues conducting current, and the output of the second inverter 250 stays at logic high. In short, the second feedback loop is formed according to the present embodiment of the invention: the high logic output from the second inverter 250 ensures that the first PMOS 252 is turned off, the first PMOS 252 being turned off allows the second PMOS 254 to continue conducting current, the current conducted by the second PMOS 254 ensures that the voltage at the node 244 stays high and thus the output from the second inverter 250 stays high, and the positive feedback process continuous.

As an example, the POR/UVLO system 220 is used in conjunction with other electronic components, such as a PWM generator and a gate driver. In one embodiment, the output provided by the second inverter 250 at logic high may be used to turn on these components and ensure these components remain functional.

Under certain conditions according to an embodiment of the present invention, components such as the PWM generator may consume more current than that provided by the power source 210. For example, where a PWM generator receives power from the power source 210 at the node 218, the PWM generator may, at times, consume more power than the power that the power source 210 is capable to supply. Consequentially, the voltage at the node 218 starts falling from the high voltage at which the PWM generator operates. Once the voltage at the node 218 falls below a predetermined voltage Vuvlo, the first PMOS 254 begins turning off. According to an embodiment of the present invention, the voltage Vuvlo is expressed by the following equation.

$$Vuvlo = Vzd2 + \frac{R1 + R2 + R3}{R1 + R2} VT\_M0 \quad \text{(Equation 2)}$$

According to Equation 2, Vdz2 is the second Zener voltage, R1 is the resistance of the first resistor 222, R2 is the resistance of the second resistor 226, R3 is the resistance of the fourth resistor 229, and VT_M0 is the threshold voltage of the second PMOS 254. When the second PMOS 254 decreases conducting current, the current that flows through the third resistor 242 decreases, causing the voltage at the node 244 to drop. Due to the voltage drop at the node 244, which is connected to the gate of the NMOS 240, the NMOS 240 decreases the current being conducted. As a part of the first positive feedback loop, the decreased current being conducted by the NMOS 240 decreases the voltage Vgs of the first PMOS 254. As the first positive feedback loops continues in operation, the first PMOS 254 eventually turns off, and the voltage at node 244 decreases to zero. As a result, the output of the first inverter 246 is at logic high and the output of the second inverter 250 is at logic low. In one embodiment, the output provided by the second inverter 250 at logic low may be used to turn off other electronic components, such as a PWM generator and a gate driver.

It is to be appreciated that the present embodiment of the invention further provides the second positive feedback loop to ensure reliable UVLO. The voltages at the first NMOS 240 and the output of second inverter 250, as operating under the condition set by an embodiment of the present invention, is shown on FIG. 3a.

Figure 3A:
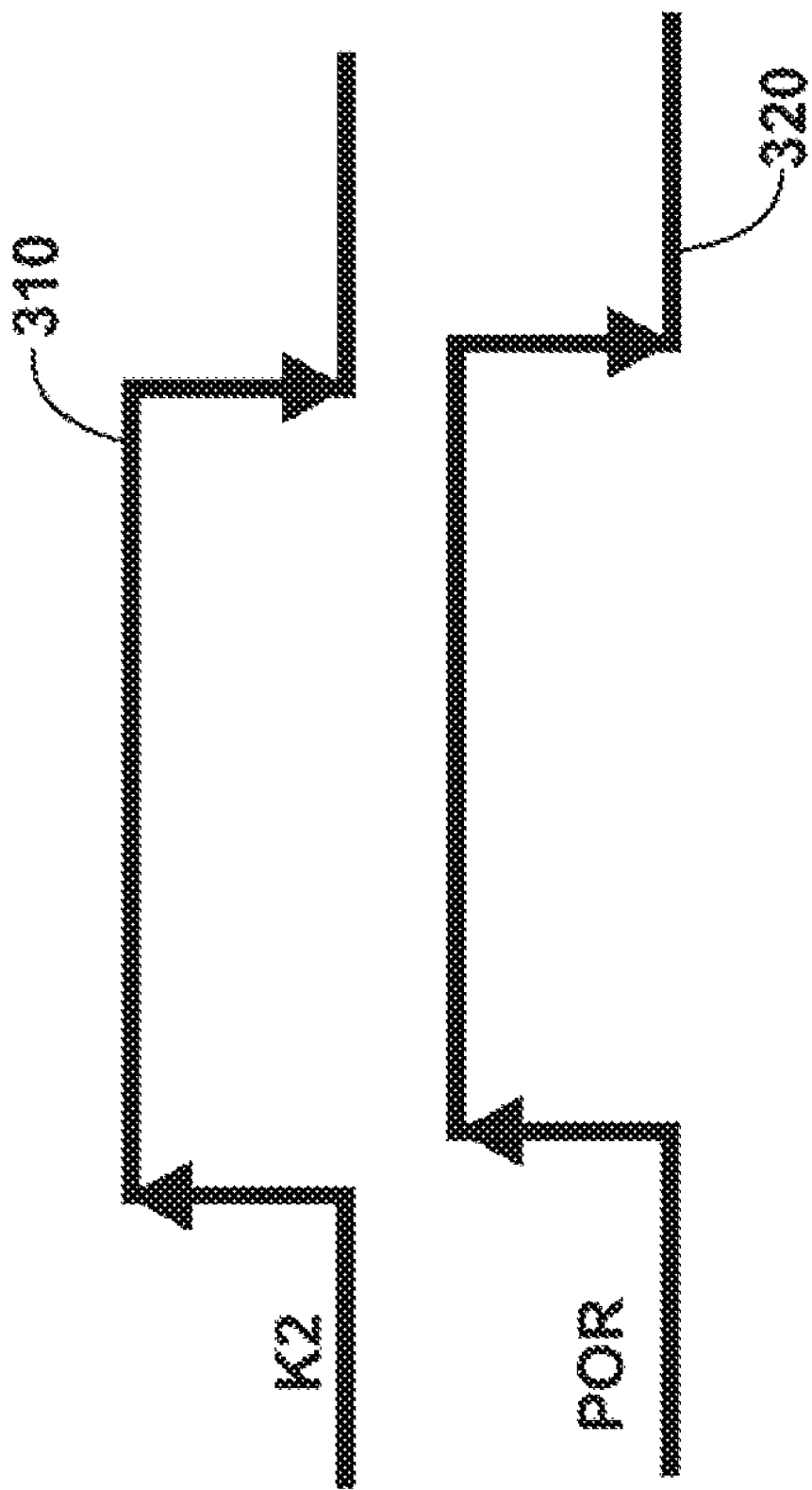
FIG. 3a is a timing diagram showing the voltages level at an NMOS and a second inverter according to an embodiment of the present invention.

FIG. 3a is a timing diagram showing the voltages level at an NMOS and a second inverter according to an embodiment of the present invention. This diagram is merely an example, which should not unduly limit the scope of the claims. One of ordinary skill in the art would recognize many variations, alternatives, and modifications. FIG. 3a shows a first voltage profile 310 for the gate of the first NMOS 240 and a second voltage profile 320 for the output of the second inverter 250. As can be seen, the voltage according to the second voltage profile usually only drops from high to low after the voltage according to the first voltage profile has dropped from high to low first. As an example applied to an embodiment of the present invention, the output of the second inverter 250 is turned to logic low after the second PMOS 240 has already been turned off. However, it is often not possible to always turn off PMOS 240 before obtaining a logic low at the output of the second inverter 250.

FIG. 3b is a timing diagram illustrating the voltages levels at an NMOS and a second inverter according to another embodiment of the present invention. This diagram is merely an example, which should not unduly limit the scope of the claims. One of ordinary skill in the art would recognize many variations, alternatives, and modifications. FIG. 3b shows a first voltage profile 330 for the gate of the first NMOS 240 and a second voltage profile 340 for the output of the second inverter 250. In contrast to FIG. 3a, the output voltage of the second inverter drops to low before the voltage level at the first NMOS reaches low. As can be seen on FIG. 3b, the voltage profile 340 for the output of the second inverter 250 drops from high to low first. As a result, the voltage profile 340 is not in synchronization with the voltage profile 330 for the first NMOS 240, and the first NMOS 240 may fall into an invalid state 350 if the second feedback loop is not included in the POR/UVLO system 220. For example, when the output of the second inverter 250 produces a logic low, this output is used to turn off a PWM generator. However, because the first NMOS 240 is not turned off, the voltage source 210 continues to deliver current. The capacitor 214 and the start up resistor 216 recharges voltage at the node 218. Due to the voltage at the node 218, the second PMOS 254 may be turned on. With PMOS 254 turned on, the voltage at node 218 may falls between Vstart and Vuvlo, i.e., lower than the start up voltage but higher than the UVLO voltage. The output of the second inverter 250 stays at logic low, and the first NMOS 240 goes into an indefinite state, i.e., neither fully on or fully off. Therefore, the first feedback loop by itself does not provide a reliable UVLO function. According to an embodiment, the second feedback loops is used to help prevent indefinite state and ensure proper function of the PWM generator. As a result, the PWM generator is turned off and cannot be restarted. It is to be appreciated that the present invention presents a novel system for providing a reliable UVLO function. According to an embodiment of the present invention, the second positive feedback loop is used to ensure the reliability of the UVLO function.

FIG. 3c is a timing diagram illustrating the voltages levels at an NMOS, a first PMOS, and a second inverter according to yet another embodiment of the present invention. This diagram is merely an example, which should not unduly limit the scope of the claims. One of ordinary skill in the art would recognize many variations, alternatives, and modifications. A second positive feedback loop is used to ensure the reliability of the UVLO function as shown in FIG. 2. FIG. 3c shows a first voltage profile 360 for the NMOS 240, a second voltage profile 370 for the output of the second inverter 250, and a third voltage profile 380 for the first PMOS 252. As an example, if the output of the second inverter 250 drops from high to low before the first NMOS 240 drops from high to low, the PWM generator is turned off by the logic low at the output of the second inverter 250. When the PWM generator is turned off and consumes no current, the capacitor 214 and the start up resistor 216 recharges voltage at the node 218, causing the voltage at the node 218 to ramp up again. At the same time, the output of the second inverter 250 at logic low turns on the first PMOS 252 and decreases the voltage Vgs of the second PMOS 254. Due to the decreased voltage at Vgs, the second PMOS delivers less current to the third resistor 242, and the voltage at the node 244 decreases. The decrease of voltage at node 244 decreases the Vgs of the NMOS 240. As the second feedback loop continues in operation, the NMOS 240 and the second PMOS 254 become fully turned off, the first PMOS 252 is turned on, and the output of the second inverter 250 stays at logic low. The POR/UVLO system 220 is itself shut off and turns off other components such as the PWM generator, along with other components.

As discussed above and further emphasized here, although the above has been shown using a selected group of components for the POR/UVLO system 220, there can be many alternatives, modifications, and variations. For example, some of the components may be expanded and/or combined. Other components may be inserted to those noted above. During upon the embodiment, the arrangement of components may be interchanged with other replaced. For example, the fourth resistor 229 may be removed from the POR/UVLO system 220. In another example, additional diodes may be used to modify start up voltage and the UVLO voltage.

Figure 4:
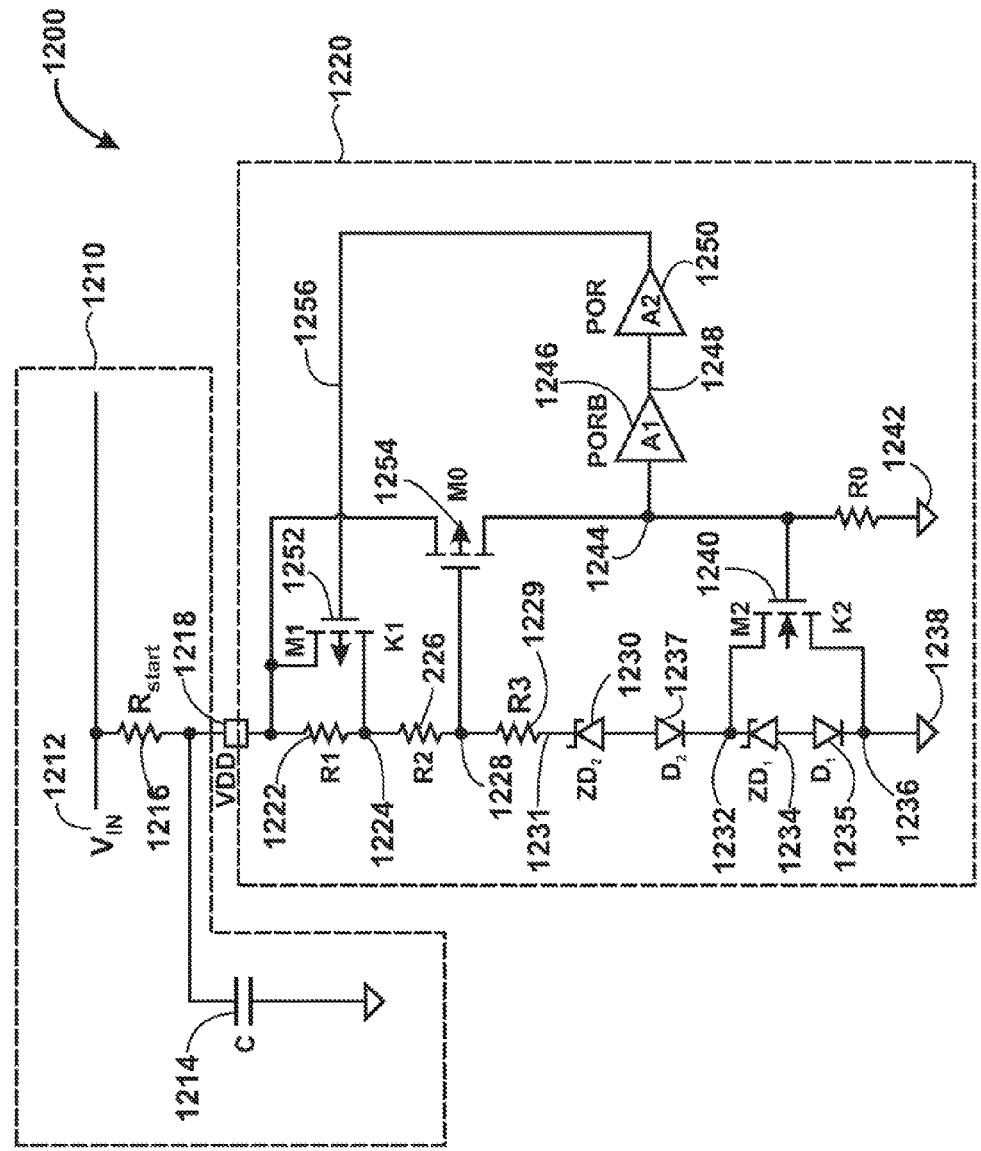
FIG. 4 is a simplified diagram of an alternative embodiment of the present invention for a system for POR/UVLO schemes.

FIG. 4 is a simplified diagram of an alternative embodiment of the present invention for a system for POR/UVLO schemes. This diagram is merely an example, which should not unduly limit the scope of the claims. One of ordinary skill in the art would recognize many variations, alternatives, and modifications. As shown in FIG. 4, a POR/UVLO system 1220 is connected to a power source 1210. The power source 1210 includes a voltage source 1212, a start up resistor 1216, and a capacitor 1214. The POR/UVLO system 1220 includes a first resistor 1222, a second resistor 1226, a third resistor 1242, a fourth resistor 1229, a first Zener diode 1230, a second Zener diode 1234, a first diode 1235, a second diode 1237, a first PMOS 1252, a second PMOS 1254, an NMOS 1240, a first inverter 1246, and a second inverter 1250. As an example, the first Zener diode is characterized by a first Zener voltage and the second Zener diode is characterized by a second Zener voltage. Although the above has been shown using a selected group of components for the POR/UVLO system 1220, there can be many alternatives, modifications, and variations. For example, some of the components may be expanded and/or combined. Other components may be inserted to those noted above. During upon the embodiment, the arrangement of components may be interchanged with other replaced.

According to an embodiment of the invention, at the power source 1210, the voltage source 1212 is connected to the start up resistor 1216 at one end. The other end of the start up resistor 1216 is connected to a node 1218. The capacitor 1214 is grounded at one end and connected to the node 1218 at the other end. The output of the power source 1210 is connected to the node 1218. The POR/UVLO system 1220 receives power at the node 1218. The first resistor 1222 is connected to the power source 1210 at the node 1218 and the second resistor 1226 at the node 1224. Also connected to the node 1218 is the source of the first PMOS 1252. The drain of the first PMOS 1252 is connected to the node 1224. For example, when there is a proper amount of voltage at the gate of the first PMOS 1252, there is little resistance between the source and the drain of the first PMOS 1252 and the resistor 1222 is essentially shorted. The second resistor 1226 is connected to the gate of the second PMOS 1254 and the fourth resistor 1229 at the node 1228. The fourth resistor is connected to the first Zener diode 1230 at the node 1231. The first Zener diode 1230 is connected to the first diode 1237 in series. The first diode 1237, at the other end, is connected to the second Zener diode 1234 at the node 1232. The second Zener diode 1234 is connected to the second diode 1235 in series. The second diode 1235, at the other end, is grounded at the node 1236. Also connected to the node 1232 is drain of the NMOS 1240, which is connected to the ground at its source. The gate of the NMOS 1240 is connected to the third resistor 1242 at the node 1244. The third resistor 1242 is connected to the ground at the node 1246. For example, when there is a proper amount of voltage at the gate of the NMOS 1240, there is little resistance between the source and the drain of the NMOS 1240 and the second Zener diode 1234 is essentially shorted. The gate of the NMOS 1240 is also connected to the first inverter 1246 and the drain of the second PMOS 1254 at the node 1244. The source of the second PMOS 1254 is connected to the node 1218. The gate of the second PMOS 1254 is connected to the node 1228. The first inverter 1246 is connected to the second inverter 1250 at the node 1248. The second inverter 1250 is connected to the gate of the first PMOS 1252 at the node 1256. The second inverter 1250 provides an output signal for the POR/UVLO system 1220.

According to an embodiment of the inventions, the POR/UVLO system 1220 operates as two positive feedback loops. A first loop includes the second PMOS 1254, the first NMOS 1240, the first Zener diode 1230, the second Zener diode 1234, the first diode 1235, the second diode 1237, the second resistor 1226, the third resistor 1242, and the fourth resistor 1229. A second loop includes the first PMOS 1252, the second PMOS 1254, the NMOS 1240, the first inverter 1246, the second inverter 1250, the second Zener diode 1230, the first diode 1235, the first resistor 1222, the second resistor 1226, the third resistor 1242, and the fourth resistor 1229.

As a example, when power source 1210 starts up, the voltage source 1212 charges the capacitor 1214 through the start up resistor 1218. During the start up, the voltage at node 1218 ramps up from zero voltage. When the voltage at node 1218 is lower than the sum of the first and the second Zener voltages and the forward voltages of the first diode 1235 and the second diode 1237, no current flows between the node 1218 and the node 1224. As a result, the first PMOS 1252 is turned on, the second PMOS 1254 is turned off, the NMOS 1240 is turned off, the first inverter 1246 is logic high, and the second inverter 1250 is logic low.

Once the voltage at node 1218 reaches a predetermined threshold voltage Vstart, the second PMOS 1254 is turned on and begins conducing current. According an embodiment of the present invention, the threshold voltage Vstart may be determined by the following equation.

$$Vstart = Vzd1 + Vzd2 + Vd1 + Vd2 + \frac{R2+R3}{R2}VT\_M0 \quad \text{(Equation 3a)}$$

According to Equation 3a, Vdz1 and Vzd2 are the first Zener voltage and the second Zener voltage, Vd1 is the forward voltage of the first diode 1235, Vd2 is the forward voltage of the second diode 1237, R2 is the resistance of the second resistor 1226, R3 is the resistance of the fourth resistor 1229, and VT_M0 is the threshold voltage of the second PMOS 1254. It is to be appreciated that additional diodes may be added to the system 1220 to modify the value of the start up voltage. Once the threshold voltage is reached, the second PMOS 1254 is turned on and start conducting current. As a result, a voltage Vr0 starts rising up between the node 1242 and the ground 1246. Once the voltage Vr0 reaches the threshold voltage of the NMOS 1240, the NMOS 1240 is turned on and begins conducting current. The current being conducted by the NMOS 1240 increases as the gate voltage (at the node 1242) of the first NMOS 1240. As a result of the increased current flow across the NMOS 1240, the Vgs (voltage between gate and source, or voltage difference between the node 1218 and the node 1228) of the second PMOS 1254 builds up due to current flowing through the second resistor 1226. As the Vgs of the second PMOS 1254 increases, more electrical current flows through the third resistor 1242, thus increasing the voltage at the node 1244.

In short, the first positive feedback loop is formed according to the present embodiment of the invention: a higher from the voltage source 1210 causes the second PMOS 1254 to conduct current, the current conducted by the second PMOS 1254 causes the NMOS 1240 to conduct current, the current conducted by the NMOS 1240 causes the second PMOS 1254 to conduct more current, and the positive process continues. When the first NMOS 1240 is fully turned on, the second Zener diode 1234 is shorted by the NMOS 1240. As a result of the second Zener diode 1234 being shorted, the gate voltage Vgs of the second PMOS 1254 is large enough to ensure that the voltage at the node 1244 is substantially equal to the voltage at the node 1218. Because of the voltage at the node 1244, the first inverter 1245 is logic low and the second inverter 1250 is logic high. The output of the second inverter 1250 is provided at the node 1256 to the first PMOS 1252.

The voltage at the node 1256, provided by the second inverter 1250, turns the first PMOS 1252 on or off. When the output of the second inverter 1250 is logic high, the first PMOS 1252 is turned on, i.e., the first PMOS 1252 is not conducting current. The first PMOS 1252 being turned off ensures that the second PMOS 1254 stays on and continues conducting current, and the output of the second inverter 1250 stays at logic high. In short, the second feedback loop is formed according to the present embodiment of the invention: the high logic output from the second inverter 1250 ensures that the first PMOS 1252 is turned off, the first PMOS 1252 being turned off allows the second PMOS 1254 to continue conducting current, the current conducted by the second PMOS 1254 ensures that the voltage at the node 1244 stays high and thus the output from the second inverter 1250 stays high, and the positive feedback process continuous.

As an example, the POR/UVLO system 1220 is used in conjunction with other electronic components, such as a PWM generator and a gate driver. The output provided by the second inverter 1250 at logic high may be used to turn out these components and ensure these components remain functional.

According to an embodiment of the present invention, components such as the PWM generator may consume more current than that provided by the power source 1210. Consequentially, the voltage at the node 1218 starts falling from the high voltage at which the PWM generator operates. Once the voltage at the node 1218 falls below a predetermined voltage Vuvlo, the first PMOS 1254 begins turning off. According to an embodiment of the present invention, the voltage Vuvlo is expressed by the following equation.

$$Vuvlo = Vzd2 + Vd2 + \frac{R1 + R2 + R3}{R1 + R2}VT\_M0 \quad \text{(Equation 4a)}$$

According to Equation 4a, Vdz2 is the second Zener voltage, Vd2 is the forward voltage of the second diode 1237, R1 is the resistance of the first resistor 1222, R2 is the resistance of the second resistor 1226, R3 is the resistance of the fourth resistor 1229, and VT_M0 is the threshold voltage of the second PMOS 1254. When the second PMOS 1254 decreases conducting current, the current that flows through the third resistor 1242 decreases, causing the voltage at the node 1244 to drop. Due to the voltage drop at the node 1244, which is connected to the gate of the NMOS 1240, the NMOS 1240 decreases the current being conducted. As a part of the first positive feedback loop, the decreased current being conducted by the NMOS 1240 decreases the voltage Vgs of the first PMOS 1254. As the first positive feedback loops continues in operation, the first PMOS 1254 eventually turns off, and the voltage at node 1244 decreases to zero. As a result, the first inverter 1246 is at logic high and the second inverter 1250 is at logic low.

Although the above has been shown using a selected group of components for the POR/UVLO system 1220, there can be many alternatives, modifications, and variations. For example, some of the components may be expanded and/or combined. Other components may be inserted to those noted above. During upon the embodiment, the arrangement of components may be interchanged with other replaced. For example, the fourth resistor 1229 may be removed from the POR/UVLO system 1220. In another example, the first diode 1235 and the second diode 1237 may be removed from the system 1220 to obtain an alternative embodiment of the present invention. In yet another example, the additional diodes may be added in series to the first and second diode to modify the operation parameters of the POR/UVLO system 1220. Additionally, PMOS and NMOS in alternative configurations may be used to implement an alternative embodiment of the present invention.

Figure 5:
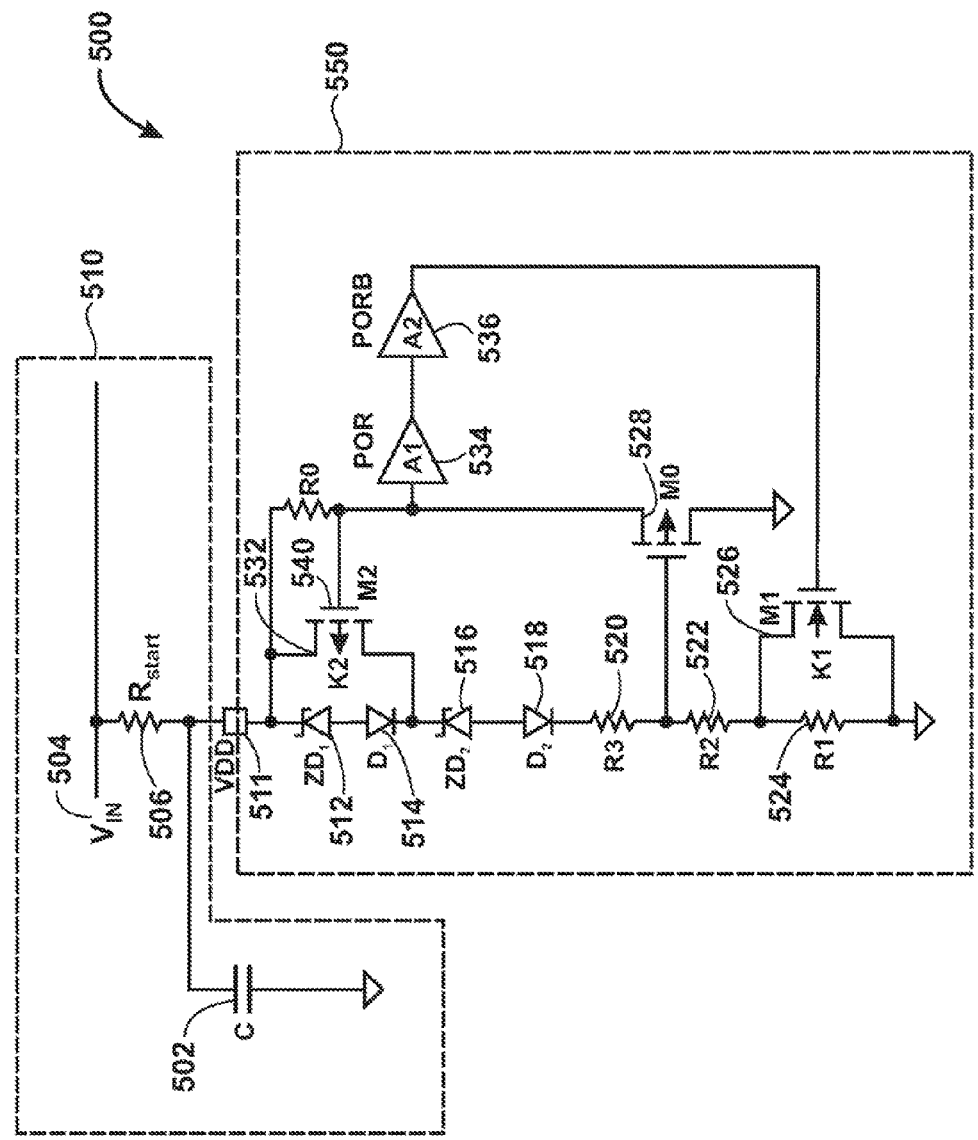
FIG. 5 is a simplified diagram of an alternative embodiment of the present invention for a system for POR/UVLO schemes implemented with two NMOS and one PMOS.

FIG. 5 is a simplified diagram of an alternative embodiment of the present invention for a system for POR/UVLO schemes implemented with two NMOS and one PMOS. This diagram is merely an example, which should not unduly limit the scope of the claims. One of ordinary skill in the art would recognize many variations, alternatives, and modifications. The system 500 includes a power source 510 and a POR/UVLO system 550. The power source includes a voltage source 504, a start up resistor 506, and a capacitor 502. The POR/UVLO system 550 includes a first diode 514, a second diode 518, a first Zener diode 512, a second Zener diode 516, a first resistor 524, a second resistor 522, a third resistor 520, a fourth resistor 530, a PMOS 532, a first NMOS 528, a second NMOS 526, a first inverter 534, and a second inverter 536. Although the above has been shown using a selected group of components for the POR/UVLO system 550, there can be many alternatives, modifications, and variations. For example, some of the components may be expanded and/or combined. Other components may be inserted to those noted above. During upon the embodiment, the arrangement of components may be interchanged with other replaced. For example, the first diode 514 and the second diode 518 may be removed.

According to FIG. 5, the power source 510 is connected supplies power to the POR/UVLO system 550 at the node 511. The voltage source 504 is connected in series to the start up resistor 506, which is connected to the capacitor 502 and the node 511. The node 511 is connected to the first Zener diode 512, the source of the PMOS 532, and the fourth resistor 540. The first Zener diode 512 is connected in series with the first diode 514. The first diode 514 is connected in series with the second Zener diode 516. The Zener diode 516 is connected in series with the second diode 518. The second diode 518 is connected in series with the third resistor 520. The third resistor 520 is connected to the second resistor 522 and the gate for the first NMOS 528. The source of the first NMOS 528 is connected to the ground. The drain of the first NMOS 528 is connected to the fourth resistor 540, the gate of the PMOS 532, and the input of the first inverter 534. The second resistor is connected to the drain of the second NMOS 526 and the first resistor 524. The first resistor 524 is connected to the ground. The source of the second NMOS 526 is connected to the ground. The gate of the second NMOS 526 is connected to the output of the second inverter 526. The input of the second inverter 526 is connected to the output of the first inverter 534. The second inverter 526 provides an output signal for the POR/UVLO system 220.

According to an embodiment of the invention, the POR/UVLO system 550 operates in essentially the same manner as the POR/UVLO system 220 in FIG. 2, utilizing two positive feedback loops. For example, the first feedback loop includes the first Zener Diode 512, the first diode 514, the second Zener diode 516, the second diode 518, the third resistor 520, the first resistor 524, the second resistor 522, the fourth resistor 540, the PMOS 532, and the first NMOS 528. The second feedback loop includes the first Zener Diode 512, the first diode 514, the third resistor 520, the first resistor 524, the second resistor 522, the fourth resistor 540, the PMOS 532, the first NMOS 528, the second NMOS 526, the first inverter 534, and the second inverter 536. According to one embodiment, the operation of the two feedback loop is substantially the same as the two feedback loops according an embodiment illustrated in FIG. 4.

Figure 6:
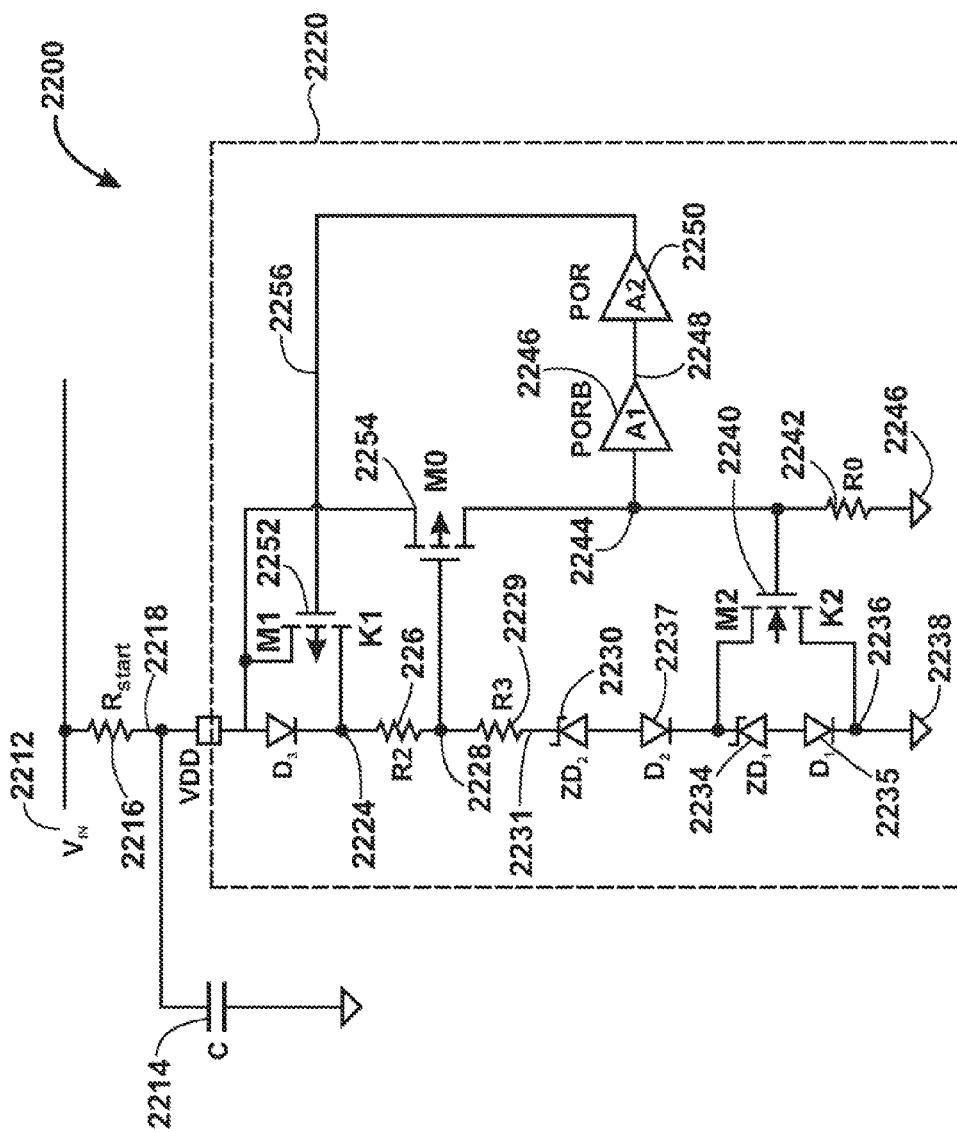
FIG. 6 is a simplified diagram of an alternative embodiment of the present invention for a system for POR/UVLO schemes.

FIG. 6 is a simplified diagram of an alternative embodiment of the present invention for a system for POR/UVLO schemes. This diagram is merely an example, which should not unduly limit the scope of the claims. One of ordinary skill in the art would recognize many variations, alternatives, and modifications. As shown in FIG. 6, a POR/UVLO system 2220 is connected to a power source 2210. The power source 2210 includes a voltage source 2212, a start up resistor 2216, and a capacitor 2214. The POR/UVLO system 2220 includes, a second resistor 1226, a third resistor 1242, a fourth resistor 1229, a first Zener diode 1230, a second Zener diode 1234, a first diode 1235, a second diode 1237, a third diode 1222, a first PMOS 1252, a second PMOS 1254, an NMOS 1240, a first inverter 1246, and a second inverter 1250. As an example, the first Zener diode is characterized by a first Zener voltage and the second Zener diode is characterized by a second Zener voltage. Although the above has been shown using a selected group of components for the POR/UVLO system 2220, there can be many alternatives, modifications, and variations. For example, some of the components may be expanded and/or combined. Other components may be inserted to those noted above. During upon the embodiment, the arrangement of components may be interchanged with other replaced.

According the present embodiment of the invention, at the power source 2210, the voltage source 2212 is connected to the start up resistor 2216 at one end. The other end of the start up resistor 2216 is connected to a node 2218. The capacitor 2214 is grounded at one end and connected to the node 2218 at the other end. The output of the power source 2210 is connected to the node 2218. The POR/UVLO system 2220 receives power at the node 2218. The third diode 2222 is connected to the power source 2210 at the node 2218 and the second resistor 2226 at the node 2224. Also connected to the node 2218 is the source of the first PMOS 2252. The drain of the first PMOS 2252 is connected to the node 2224. For example, when there is a proper amount of voltage at the gate of the first PMOS 2252, there is little resistance between the source and the drain of the first PMOS 2252 and the third diode 2222 is essentially shorted. The second resistor 2226 is connected to the gate of the second PMOS 2254 and the fourth resistor 2229 at the node 2228. The fourth resistor is connected to the first Zener diode 2230 at the node 2231. The first Zener diode 2230 is connected to the first diode 2237 in series. The first diode 2237, at the other end, is connected to the second Zener diode 2234 at the node 2232. The second Zener diode 2234 is connected to the second diode 2235 in series. The second diode 2235, at the other end, is grounded at the node 2236. Also connected to the node 2232 is drain of the NMOS 2240, which is connected to the ground at its source. The gate of the NMOS 2240 is connected to the third resistor 2242 at the node 2244. The third resistor 2242 is connected to the ground at the node 2246. For example, when there is a proper amount of voltage at the gate of the NMOS 2240, there is little resistance between the source and the drain of the NMOS 2240 and the second Zener diode 2234 is essentially shorted. The gate of the NMOS 2240 is also connected to the first inverter 2246 and the drain of the second PMOS 1254 at the node 2244. The source of the second PMOS 1254 is connected to the node 1218. The gate of the second PMOS 2254 is connected to the node 2228. The first inverter 1246 is connected to the second inverter 2250 at the node 2248. The second inverter 1250 is connected to the gate of the first PMOS 2252 at the node 2256. The second inverter 2250 provides an output signal for the POR/UVLO system 2220.

According to the present embodiment of the inventions, the POR/UVLO system 2220 operates as two positive feedback loops. A first loop includes the second PMOS 2254, the first NMOS 2240, the first Zener diode 2230, the second Zener diode 2234, the first diode 2235, the second diode 2237, the second resistor 2226, the third resistor 2242, and the fourth resistor 2229. A second loop includes the first PMOS 2252, the second PMOS 2254, the NMOS 2240, the first inverter 2246, the second inverter 2250, the second Zener diode 2230, the first diode 2235, the third diode 2222, the second resistor 2226, the third resistor 2242, and the fourth resistor 2229.

As a example, when power source 2210 starts up, the voltage source 2212 charges the capacitor 2214 through the start up resistor 2218. During the start up, the voltage at node 2218 ramps up from zero voltage. When the voltage at node 2218 is lower than the sum of the first and the second Zener voltages and the forward voltages of the first diode 2235 and the second diode 1237, no current flows between the node 2218 and the node 2224. As a result, the first PMOS 2252 is turned on, the second PMOS 2254 is turned off, the NMOS 2240 is turned off, the first inverter 2246 is logic high, and the second inverter 2250 is logic low.

Once the voltage at node 2218 reaches a predetermined threshold voltage Vstart, the second PMOS 2254 is turned on and begins conducing current. According an embodiment of the present invention, the threshold voltage Vstart may be determined by the following equation.

$$Vstart = Vzd1 + Vzd2 + Vd1 + Vd2 + Vd3 + \frac{R2 + R3}{R2} VT\_M0 \qquad \text{(Equation 3b)}$$

According to Equation 3b, Vdz1 and Vzd2 are the first Zener voltage and the second Zener voltage, Vd1 is the forward voltage of the first diode 2235, Vd2 is the forward voltage of the second diode 2237, Vd3 is the forward voltage of the third diode 2222, R2 is the resistance of the second resistor 2226, R3 is the resistance of the fourth resistor 2229, and VT_M0 is the threshold voltage of the second PMOS 2254. It is to be appreciated that additional diodes may be added to the system 2220 to modify the value of the start up voltage. Once the threshold voltage is reached, the second PMOS 2254 is turned on and start conducting current. As a result, a voltage Vr0 starts rising up between the node 2242 and the ground 1246. Once the voltage Vr0 reaches the threshold voltage of the NMOS 2240, the NMOS 2240 is turned on and begins conducting current. The current being conducted by the NMOS 2240 increases as the gate voltage (at the node 2242) of the first NMOS 2240. As a result of the increased current flow across the NMOS 2240, the Vgs (voltage between gate and source, or voltage difference between the node 2218 and the node 2228) of the second PMOS 2254 builds up due to current flowing through the second resistor 2226. As the Vgs of the second PMOS 2254 increases, more electrical current flows through the third resistor 2242, thus increasing the voltage at the node 2244.

In short, the first positive feedback loop is formed according to the present embodiment of the invention: a higher from the voltage source 2210 causes the second PMOS 2254 to conduct current, the current conducted by the second PMOS 2254 causes the NMOS 2240 to conduct current, the current conducted by the NMOS 2240 causes the second PMOS 2254 to conduct more current, and the positive process continues.

When the first NMOS 2240 is fully turned on, the second Zener diode 2234 is shorted by the NMOS 2240. As a result of the second Zener diode 2234 being shorted, the gate voltage Vgs of the second PMOS 2254 is large enough to ensure that the voltage at the node 2244 is substantially equal to the voltage at the node 2218. Because of the voltage at the node 2244, the first inverter 2245 is logic low and the second inverter 2250 is logic high. The output of the second inverter 2250 is provided at the node 2256 to the first PMOS 2252.

The voltage at the node 2256, provided by the second inverter 2250, turns the first PMOS 2252 on or off. When the output of the second inverter 2250 is logic high, the first PMOS 2252 is turned on, i.e., the first PMOS 2252 is not conducting current. The first PMOS 1252 being turned off ensures that the second PMOS 1254 stays on and continues conducting current, and the output of the second inverter 1250 stays at logic high. In short, the second feedback loop is formed according to the present embodiment of the invention: the high logic output from the second inverter 2250 ensures that the first PMOS 2252 is turned off, the first PMOS 2252 being turned off allows the second PMOS 2254 to continue conducting current, the current conducted by the second PMOS 2254 ensures that the voltage at the node 2244 stays high and thus the output from the second inverter 2250 stays high, and the positive feedback process continuous.

As an example, the POR/UVLO system 2220 is used in conjunction with other electronic components, such as a PWM generator and a gate driver. The output provided by the second inverter 2250 at logic high may be used to turn out these components and ensure these components remain functional.

According to an embodiment of the present invention, components such as the PWM generator may consume more current than that provided by the power source 2210. Consequentially, the voltage at the node 2218 starts falling from the high voltage at which the PWM generator operates. Once the voltage at the node 2218 falls below a predetermined voltage Vuvlo, the first PMOS 2254 begins turning off. According to an embodiment of the present invention, the voltage Vuvlo is expressed by the following equation.

$$Vuvlo = Vzd2 + Vd2 + Vd3 + \frac{R2 + R3}{R2} VT\_M0 \quad \text{(Equation 4b)}$$

According to Equation 4b, Vdz2 is the second Zener voltage, Vd2 is the forward voltage of the second diode 2237, Vd3 is the forward voltage of the third diode 2222, R2 is the resistance of the second resistor 2226, R3 is the resistance of the fourth resistor 2229, and VT_M0 is the threshold voltage of the second PMOS 2254. When the second PMOS 2254 decreases conducting current, the current that flows through the third resistor 2242 decreases, causing the voltage at the node 2244 to drop. Due to the voltage drop at the node 2244, which is connected to the gate of the NMOS 2240, the NMOS 2240 decreases the current being conducted. As a part of the first positive feedback loop, the decreased current being conducted by the NMOS 2240 decreases the voltage Vgs of the first PMOS 2254. As the first positive feedback loops continues in operation, the first PMOS 2254 eventually turns off, and the voltage at node 2244 decreases to zero. As a result, the first inverter 2246 is at logic high and the second inverter 2250 is at logic low.

Although the above has been shown using a selected group of components for the POR/UVLO system 2220, there can be many alternatives, modifications, and variations. For example, some of the components may be expanded and/or combined. Other components may be inserted to those noted above. During upon the embodiment, the arrangement of components may be interchanged with other replaced. For example, the fourth resistor 2229 may be removed from the POR/UVLO system 2220. In another example, the first diode 2235 and the second diode 1237 may be removed from the system 2220 to obtain an alternative embodiment of the present invention. In yet another example, the additional diodes may be added in series to the first and second diode to modify the operation parameters of the POR/UVLO system 2220. Additionally, PMOS and NMOS in alternative configurations may be used to implement an alternative embodiment of the present invention.

Figure 7:
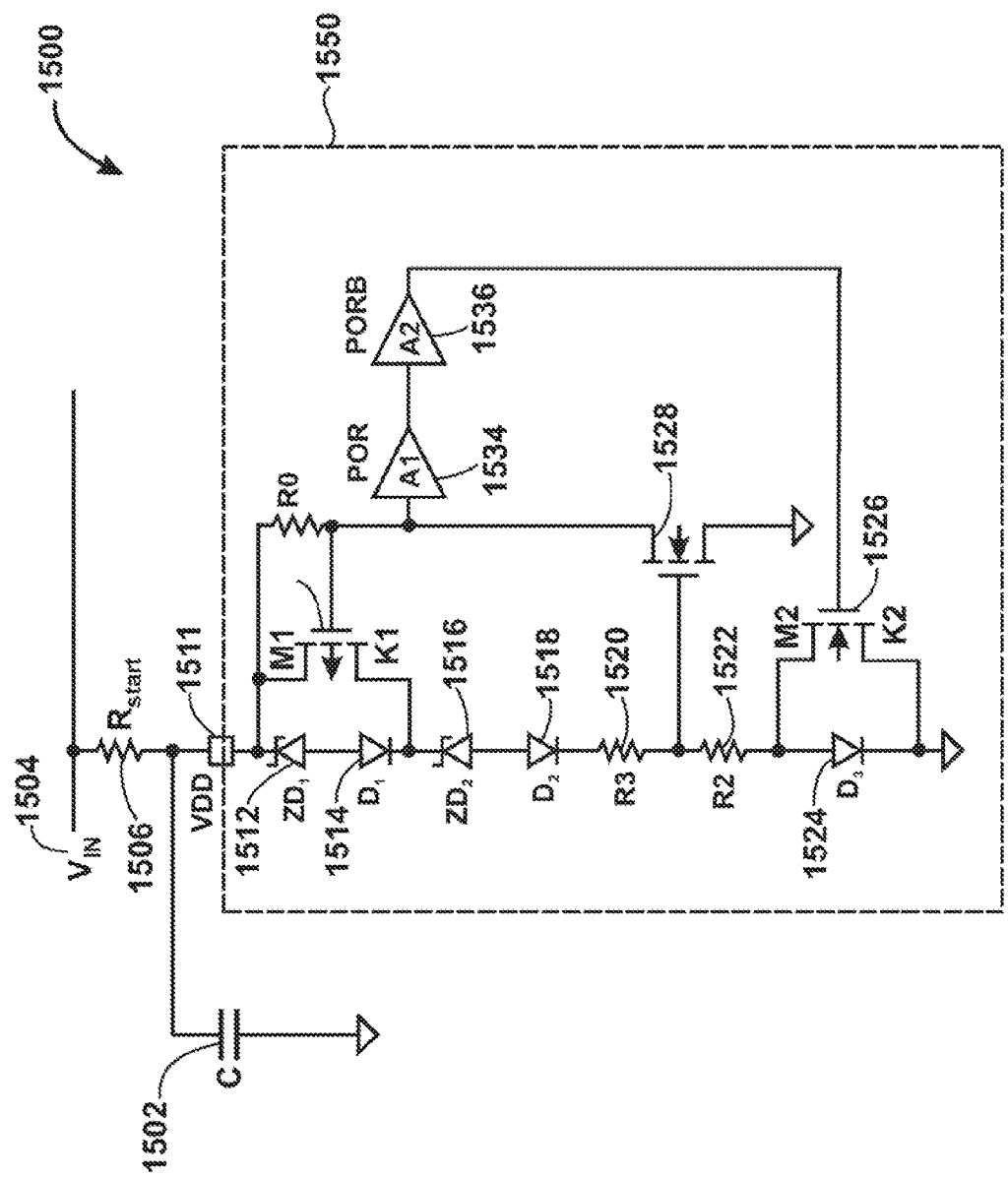
FIG. 7 is a simplified diagram of an alternative embodiment of the present invention for a system for POR/UVLO schemes implemented with two NMOS and one PMOS.

FIG. 7 is a simplified diagram of an alternative embodiment of the present invention for a system for POR/UVLO schemes implemented with two NMOS and one PMOS. This diagram is merely an example, which should not unduly limit the scope of the claims. One of ordinary skill in the art would recognize many variations, alternatives, and modifications. The system 1500 includes a power source 1510 and a POR/UVLO system 1550. The power source includes a voltage source 1504, a start up resistor 1506, and a capacitor 1502. The POR/UVLO system 1550 includes a first diode 1514, a second diode 1518, a third diode 1524, a first Zener diode 1512, a second Zener diode 1516, a second resistor 1522, a third resistor 1520, a fourth resistor 1530, a PMOS 1532, a first NMOS 1528, a second NMOS 1526, a first inverter 1534, and a second inverter 1536. Although the above has been shown using a selected group of components for the POR/UVLO system 1550, there can be many alternatives, modifications, and variations. For example, some of the components may be expanded and/or combined. Other components may be inserted to those noted above. During upon the embodiment, the arrangement of components may be interchanged with other replaced. For example, the first diode 1514 and the second diode 1518 may be removed.

According to FIG. 7, the power source 1510 is connected supplies power to the POR/UVLO system 1550 at the node 1511. The voltage source 1504 is connected in series to the start up resistor 1506, which is connected to the capacitor 1502 and the node 1511. The node 1511 is connected to the first Zener diode 1512, the source of the PMOS 1532, and the fourth resistor 1540. The first Zener diode 1512 is connected in series with the first diode 1514. The first diode 1514 is connected in series with the second Zener diode 1516. The Zener diode 1516 is connected in series with the second diode 1518. The second diode 1518 is connected in series with the third resistor 1520. The third resistor 1520 is connected to the second resistor 1522 and the gate for the first NMOS 1528. The source of the first NMOS 1528 is connected to the ground. The drain of the first NMOS 1528 is connected to the fourth resistor 1540, the gate of the PMOS 1532, and the input of the first inverter 1534. The second resistor is connected to the drain of the second NMOS 1526 and the third diode 1524. The third diode 1524 is connected to the ground. The source of the second NMOS 1526 is connected to the ground. The gate of the second NMOS 1526 is connected to the output of the second inverter 1526. The input of the second inverter 526 is connected to the output of the first inverter 1534. The second inverter 1526 provides an output signal for the POR/UVLO system 1220.

According to an embodiment of the invention, the POR/UVLO system 1550 operates in essentially the same manner as the POR/UVLO system 1220 in FIG. 2, utilizing two positive feedback loops. For example, the first feedback loop includes the first Zener Diode 1512, the first diode 1514, the second Zener diode 1516, the second diode 1518, the third resistor 1520, the third diode 1524, the second resistor 1522, the fourth resistor 1540, the PMOS 1532, and the first NMOS 1528. The second feedback loop includes the first Zener Diode 1512, the first diode 1514, the third resistor 1520, the third diode 1524, the second resistor 1522, the fourth resistor 1540, the PMOS 1532, the first NMOS 1528, the second NMOS 1526, the first inverter 1534, and the second inverter 1536. According to an embodiment, the operation of the two feedback loop is substantially the same as the two feedback loops according an embodiment illustrated in FIG. 4.

As discussed above and further emphasized here, FIGS. 2, 4, 5, 6, and 7 are merely examples, which should not unduly limit the scope of the claims. One of ordinary skill in the art would recognize many variations, alternatives, and modifications. For example, some or all Zener diodes in FIGS. 2, 4, and/or 5 can be replaced by other types of voltage-regulator diodes. In one embodiment, a voltage-regulator diode is a Zener diode. In another embodiment, a voltage-regulator diode is a breakdown diode.

According to an embodiment, the present invention presents system for providing power-on reset and under-voltage lockout signals. The system includes a first transistor, which includes a first gate, a first terminal, and a second terminal, the second terminal being biased to a predetermined voltage. The system also a second transistor, which include a second gate, a third terminal, and a fourth terminal, the third terminal being configured to receive an input voltage. Additionally, the system includes a first resistor that is associated with a first resistance. The first resistor includes a fifth terminal and a sixth terminal, the fifth terminal being configured to receive the input voltage. The system also a second resistor that is associated with a second resistance. The second resistor includes a seventh terminal and an eighth terminal, the seventh terminal being coupled to the sixth terminal. In addition, the system includes a first Zener diode that is associated with a first Zener voltage. The first Zener diode includes a ninth terminal and a tenth terminal, the ninth terminal being biased to the predetermined voltage. Moreover, the system includes a second Zener diode that is associated with a second Zener voltage. The second Zener diode includes an eleventh terminal and a twelfth terminal. The system additionally includes a third resistor that is associated with a third resistance. The third resistor includes a thirteenth terminal and a fourteenth terminal, the fourteenth terminal being biased to the predetermined voltage. At the system, the first gate is coupled to the fourth terminal and the thirteenth terminal to generate a first signal. The first signal is capable of being associated with at least one of a power-on reset or an under-voltage lockout. The second gate is coupled to the eighth terminal and the twelfth terminal. And the first terminal, the tenth terminal and the eleventh terminal are coupled to each other. For example, the system is implemented according to FIGS. 2 and/or 4.

According to an alternative embodiment, the present invention provides a system for providing power-on reset and under-voltage lockout signals. The system includes a first transistor, which includes a first gate, a first terminal, and a second terminal, the second terminal being biased to a predetermined voltage. The system additionally includes a second transistor, which includes a second gate, a third terminal, and a fourth terminal, the third terminal being configured to receive an input voltage. In addition, the system includes a first resistor that is associated with a first resistance. The first resistor includes a fifth terminal and a sixth terminal, the fifth terminal being configured to receive the input voltage. The system also includes a second resistor that is associated with a second resistance. The second resistor includes a seventh terminal and an eighth terminal, the seventh terminal being coupled to the sixth terminal. In addition, the system includes a first Zener diode that is associated with a first Zener voltage. The first Zener diode includes a ninth terminal and a tenth terminal, the ninth terminal being biased to the predetermined voltage. Additionally, the system includes a second Zener diode that is associated with a second Zener voltage. The second Zener diode includes an eleventh terminal and a twelfth terminal. The system additionally includes a third resistor that is associated with a third resistance. The third resistor includes a thirteenth terminal and a fourteenth terminal, the fourteenth terminal coupled to the second terminal. Moreover, the system includes a third transistor, which includes a third gate, a fifteenth terminal, and a fourteenth terminal. The fifteenth terminal is configured to receive the input voltage, and sixteenth terminal are coupled to the sixth terminal. The system additionally includes a first inverter that includes a first inverter input and a first inverter output. The system also includes a second inverter that includes a second inverter input and a second inverter output. The second inverter input is coupled to the first inverter output, and the second inverter output is coupled to the third gate. At the system, the first gate is coupled to the fourth terminal and the thirteenth terminal. The second gate is coupled to the eighth terminal and the twelfth terminal. The first terminal, the tenth terminal and the eleventh terminal are coupled to each other. The second inverter output is configured to generate a signal, the signal capable of being associated with at least one of a power-on reset or an under-voltage lockout. For example, the system is implemented according to FIGS. 2 and/or 4.

According to another alternative embodiment, the present invention provides a system for providing power-on reset and under-voltage lockout signals. The system includes a first transistor, which includes a first gate, a first source, and a first drain. The first source is biased at a predetermined voltage. The system also includes a second transistor that includes a second gate, a second source, and a second drain. The second gate is coupled to the first drain, and the second source being biased at the predetermined voltage. In addition, the system includes a third transistor, which includes a third gate, a third source, and a third drain. The third source is biased at a predetermined voltage. Additionally, the system includes a first resistor that includes a first terminal and a second terminal. The first terminal is biased at the predetermined voltage. The system also includes a second resistor. The second resistor includes a third terminal and a fourth terminal. The third terminal is coupled to the second terminal. The fourth terminal is coupled to the first gate. The system also includes a third resistor. The third resistor includes a fifth terminal and a sixth terminal. The fifth terminal is coupled to the fourth terminal. The system additionally includes a fourth resistor, which includes a seventh terminal and an eighth terminal. The eighth terminal is configured to receive the input voltage. The seventh terminal is coupled to the second gate. The system additionally includes a first Zener diode that includes a ninth terminal and a tenth terminal. The ninth terminal is coupled to the sixth terminal. The tenth terminal is coupled to the second drain. They system also includes a second Zener diode. The second diode includes an eleventh terminal and a twelfth terminal. The eleventh terminal is coupled to the tenth terminal. The twelfth terminal is configured to receive the input voltage. The system also includes a first inverter that includes a first inverter input and a first inverter output. The first inverter input is coupled to the first drain. Additionally, the system includes a second inverter, which includes a second inverter input and a second inverter output. The second inverter input is coupled to the first inverter output. The second inverter output is coupled to the third gate. At the system, the second inverter output is configured to generate a signal. The signal is capable of being associated with at least one of a power-on reset and an under-voltage lockout. For example, the system is implemented according to FIG. 5.

According to another alternative embodiment, the present invention provides a system for providing power-on reset and under-voltage lockout signals. The system includes a first transistor, which includes a first gate, a first terminal, and a second terminal. The second terminal is biased to a predetermined voltage. Additionally, the system includes a second transistor, which includes a second gate, a third terminal, and a fourth terminal. The third terminal is configured to receive an input voltage. The system also includes a first diode associated with a forward voltage. The first diode includes a fifth terminal and a sixth terminal. The fifth terminal is configured to receive the input voltage. In addition, the system includes a second resistor associated with a second resistance. The second resistor includes a seventh terminal and an eighth terminal. The seventh terminal being coupled to the sixth terminal. The system additionally includes a first Zener diode associated with a first Zener voltage. The first Zener diode includes a ninth terminal and a tenth terminal. The ninth terminal is biased to the predetermined voltage. The system also includes a second Zener diode associated with a second Zener voltage. The second Zener diode includes an eleventh terminal and a twelfth terminal. Additionally, the system includes a third resistor associated with a third resistance. The third resistor includes a thirteenth terminal and a fourteenth terminal. The fourteenth terminal is coupled to the second terminal. Additionally, the system includes a third transistor, which includes a third gate, a fifteenth terminal, and a fourteenth terminal. The fifteenth terminal is configured to received the input voltage. The sixteenth terminal is coupled to the sixth terminal. The system also includes a first inverter, which includes a first inverter input and a first inverter output. Moreover, the system includes a second inverter, which includes a second inverter input and a second inverter output. The second inverter input is coupled to the first inverter output. The second inverter output is coupled to the third gate. The first gate is coupled to the fourth terminal and the thirteenth terminal. The second gate is coupled to the eighth terminal and the twelfth terminal. The first terminal, the tenth terminal and the eleventh terminal are coupled to each other. The second inverter output is configured to generate a signal, the signal capable of being associated with at least one of a power-on reset or an under-voltage lockout. For example, the system is implemented according to FIG. 6.

According to another alternative embodiment, the present invention provides a system for providing power-on reset and under-voltage lockout signals. The system includes a first transistor, which includes a first gate, a first source, and a first drain. The first source is biased at a predetermined voltage. Additionally, the system includes a second transistor, which includes a second gate, a second source, and a second drain. The second gate is coupled to the first drain. The second source is configured to receive an input voltage. The system also includes a third transistor, which includes a third gate, a third source, and a third drain. The third source is biased at the predetermined voltage. The system also includes a first diode, which includes a first terminal and a second terminal. The first terminal is biased at the predetermined voltage. Additionally, the system includes a second resistor. The second resistor includes a third terminal and a fourth terminal. The third terminal is coupled to the second terminal. The fourth terminal is coupled to the first gate. The system also includes a third resistor, which includes a fifth terminal and a sixth terminal. The fifth terminal is coupled to the fourth terminal. Moreover, the system includes a fourth resistor, which includes a seventh terminal and an eighth terminal. The eighth terminal is configured to receive the input voltage. The seventh terminal is coupled to the second gate. The system also includes a first Zener diode, which includes a ninth terminal and a tenth terminal. The ninth terminal is coupled to the sixth terminal, and the tenth terminal is coupled to the second drain. Additionally the system includes a second Zener diode. The second Zener diode includes an eleventh terminal and a twelfth terminal. The eleventh terminal is coupled to the tenth terminal. The twelfth terminal is configured to receive the input voltage. The system additionally includes a first inverter. The first inverter includes a first inverter input and a first inverter output. The first inverter input is coupled to the first drain. The system also includes a second inverter, which includes a second inverter input and a second inverter output. The second inverter input is coupled to the first inverter output. The second inverter output is coupled to the third gate. The second inverter output is configured to generate a signal. The signal is capable of being associated with at least one of a power-on reset and an under-voltage lockout. For example, the system is implemented according to FIG. 7.

Many benefits are achieved by way of the present invention over conventional techniques. It is to be appreciated that certain embodiments of the present invention provide a system and method for POR/UVLO schemes that provide lower power consumption and better reliability. According to an embodiment of the present invention, two positive feedback loops are used to ensure the reliability of the UVLO function.

It is understood the examples and embodiments described herein are for illustrative purposes only and that various modifications or changes in light thereof will be suggested to persons skilled in the art and are to be included within the spirit and purview of this application and scope of the appended claims.

What is claimed is:

1. A system for providing power-on reset and under-voltage lockout signals, the system comprising:
   a first transistor including a first gate, a first terminal, and a second terminal, the second terminal being biased to a predetermined voltage;
   a second transistor including a second gate, a third terminal, and a fourth terminal, the third terminal being configured to receive an input voltage;
   a first resistor associated with a first resistance, the first resistor including a fifth terminal and a sixth terminal, the fifth terminal being configured to receive the input voltage;
   a second resistor associated with a second resistance, the second resistor including a seventh terminal and an eighth terminal, the seventh terminal being coupled to the sixth terminal;
   a Zener diode associated with a Zener voltage, the Zener diode including a ninth terminal and a tenth terminal, the ninth terminal being biased to the predetermined voltage; and
   a third resistor associated with a third resistance, the third resistor including an eleventh terminal and a twelfth terminal, the twelfth terminal being biased to the predetermined voltage;
   wherein the first gate is coupled to the fourth terminal and the eleventh terminal to generate a first signal, the first signal capable of being associated with at least one selected from a group consisting of a power-on reset and an under-voltage lockout.

2. The system of claim 1 wherein the input voltage is higher than the predetermined voltage.

3. The system of claim 1 wherein the first transistor is an NMOS transistor, and the second transistor is a PMOS transistor.

4. The system of claim 1 wherein the predetermined voltage is a ground voltage.

5. The system of claim 1 wherein:
the first terminal is a first drain and the second terminal is a first source; and
the third terminal is a second source and the fourth terminal is a second drain.

6. The system of claim 1 wherein if the input voltage is below a first threshold voltage, the first signal is associated with a first state.

7. The system of claim 6 wherein if the input voltage is above a second threshold voltage, the first signal is associated with a second state, the second threshold voltage being higher than the first threshold voltage.

8. The system of claim 7 wherein:
the first state is related to turning off one or more devices coupled to the system; and
the second state is related to turning on the one or more devices coupled to the system.

9. The system of claim 1, and further comprising:
a power source;
wherein the power source comprises:
  a start up resistor associated with a start up resistance, the start up resistor including a thirteenth terminal and a fourteenth terminal; and
  a capacitor associated with a capacitance, the capacitor including a fifteenth terminal and a sixteenth terminal, the fifteenth terminal being coupled to the fourteenth terminal, the sixteenth terminal being biased at the predetermined voltage;
wherein the power source is configured to provide the input voltage at the fourteenth terminal.

10. The system of claim 1, and further comprising:
a third transistor including a third gate, a thirteenth terminal, and a fourteenth terminal, the thirteenth terminal being configured to receive the input voltage, and the fourteenth terminal being coupled to the sixth terminal;
a first inverter including a first inverter input and a first inverter output; and
a second inverter including a second inverter input and a second inverter output, the second inverter input being coupled to the first inverter output, the second inverter output being coupled to the third gate.

11. The system of claim 10 wherein if the input voltage is below a first threshold voltage, the second inverter is configured to provide a second signal indicating a first state, the first state being related to turning off one or more devices coupled to the system.

12. The system of claim 11 wherein if the input voltage is above a second threshold voltage, the second inverter is configured to provide the second signal indicating a second state, the second state being related to turning on the one or more devices coupled to the system.

13. The system of claim 12 wherein the first threshold voltage is lower than the second threshold voltage.

14. The system of claim 1, and further comprising:
a first diode;
wherein the first terminal is coupled to the tenth terminal through the first diode.

15. The system of claim 14, and further comprising:
a second diode;
wherein the ninth terminal is coupled to the second terminal through the second diode.

* * * * *